United States Patent [19]
Kadono et al.

[11] Patent Number: 5,534,102
[45] Date of Patent: Jul. 9, 1996

[54] COMPONENT SUPPLY METHOD

[75] Inventors: Nobuaki Kadono; Kenichirou Kidou, both of Nagaokakyo, Japan

[73] Assignee: Murata Manufacturing Co., Ltd., Japan

[21] Appl. No.: 290,343

[22] Filed: Aug. 15, 1994

Related U.S. Application Data

[63] Continuation of Ser. No. 2,270, Jan. 8, 1993, abandoned.

[30] Foreign Application Priority Data

Jan. 8, 1992 [JP] Japan .................................. 4-001472

[51] Int. Cl.⁶ .................................................. B32B 31/00
[52] U.S. Cl. ........................ 156/250; 156/344; 437/226
[58] Field of Search ............................. 156/250, 268, 156/289, 344, 584; 437/226

[56] References Cited

U.S. PATENT DOCUMENTS

| | | | |
|---|---|---|---|
| 3,706,409 | 12/1972 | Lederer | 228/6 |
| 3,809,050 | 5/1974 | Chough et al. | 125/35 |
| 3,851,758 | 12/1974 | Makhijani et al. | 206/328 |
| 4,542,397 | 9/1985 | Biegelsen et al. | 357/32 |
| 4,921,564 | 5/1990 | Moore | 156/344 |
| 4,961,804 | 10/1990 | Aurichio | 156/248 |
| 5,270,260 | 12/1993 | Scheuenpflug | 437/209 |

FOREIGN PATENT DOCUMENTS

| | | |
|---|---|---|
| 0473976 | 8/1992 | European Pat. Off. . |
| 2219135 | 11/1989 | United Kingdom . |

*Primary Examiner*—David A. Simmons
*Assistant Examiner*—Paul M. Rivard
*Attorney, Agent, or Firm*—Ostrolenk, Faber, Gerb & Soffen

[57] ABSTRACT

A component supply method includes the steps of sticking an adhesive sheet, which is provided on its upper surface with a first foam releasable adhesive layer whose adhesion, can be reduced by heating, onto an upper surface of a pallet having a side surface serving as a reference portion, sticking a wafer onto the upper surface of the adhesive sheet, cutting the wafer for obtaining a number of components, reducing the adhesion of the first adhesive layer by heating, and taking out the individual components, obtained by cutting the wafer, from the pallet. In the steps of sticking the adhesive sheet, sticking the wafer and taking out the components, the elements are located on the basis of the side surface of the pallet serving as a reference portion.

16 Claims, 5 Drawing Sheets

COMPONENT SUPPLY METHOD

This is a continuation of application Ser. No. 08/002,270 filed on Jan. 8, 1993, now abandoned.

BACKGROUND OF THE INVENTION

1. Field of the Invention

The present invention relates to a component supply method for obtaining individual components by cutting a wafer of ceramic or silicon, for example, and supplying the as-obtained individual components to a subsequent processing step.

2. Description of the Background Art

In relation to a technique of obtaining a number of silicon chips from a silicon wafer, the following two methods are well known in the art:

In the first method, an adhesive sheet which is provided on its one surface with an adhesive layer whose adhesion can be reduced by irradiation with ultraviolet rays is prepared. As shown in FIG. 2, a wafer 2 is stuck onto a surface of such an adhesive sheet 1 provided with an adhesive layer. Then, the wafer 2 is diced to be subdivided into individual silicon chips 3. Then, ultraviolet rays are applied to reduce adhesion of the adhesive layer provided on the adhesive sheet 1. Thereafter the adhesive sheet 1 is mounted on an expander which is carried on an X-Y drive unit. Then, the adhesive sheet 1 is expanded by the expander so that its area is enlarged as shown in FIGS. 3A and 3B, thereby separating the respective silicon chips 3 from each other. Referring to FIGS. 3A and 3B, the adhesive sheet 1 is mounted on adhesive sheet mounting members 4 which are provided in the expander.

When the silicon chips 3 are separated from each other through clearances as described above, positional information of each silicon chip 3 is obtained through an image taken by a camera on the adhesive sheet 1, and the X-Y drive unit is driven on the basis of such positional information to locate the silicon chip 3 to be taken out on a chip discharge position.

On the other hand, a thrust pin 5 is arranged under such a chip discharge position as shown in FIG. 4, while a suction chuck 6 is arranged above the silicon chip 3. In this chip discharge position, the thrust pin 5 is upwardly driven as shown in FIG. 4 to upwardly move the silicon chip 3 to be removed, so that this silicon chip 3 is sucked by the suction chuck 6 in this state and carried to be supplied to a next step.

The second method utilizes a foam releasable adhesive sheet, which is formed by a base material having a foam releasable adhesive layer, whose adhesion can be reduced by heating, provided on one surface and another adhesive layer, whose adhesion can not be reduced by heating, provided on another surface. In the second method, the adhesive layer provided on the other side of such a foam releasable adhesive sheet is stuck onto a flat plate type support member to expose the foam releasable adhesive layer, so that a silicon wafer is stuck onto the foam releasable adhesive layer and diced to be subdivided into individual silicon chips. Then the plate type support member is heated to reduce the adhesion of the foam releasable adhesive layer, and the respective silicon chips are separated from this layer at random to obtain a number of silicon chips.

In the first method, each silicon chip is located in the discharge position through image processing. Therefore, a high-priced image processor is required and it takes time for such processing, leading to insufficient component suppliability. Further, the thrust pin 5 is so worn upon repeated employment that the same must be replaced by a new one. In addition, the silicon chip 3 may be damaged by impact applied by the thrust pin 5.

On the other hand, the second method can be carried out at a low cost since no image processor is required. In this method, however, the adhesion of the foam releasable adhesive layer is reduced by heating to separate a number of silicon chips from this layer at random. In order to systematically supply such silicon chips to a next step, therefore, it is necessary to realign the as-obtained number of silicon chips with a complicated operation.

SUMMARY OF THE INVENTION

An object of the preferred embodiments of the present invention is to provide a method of supplying a number of components obtained by subdividing a wafer in high suppliability with substantially no damage to the components, which can systematically supply a number of components to a next step at a low cost.

The preferred embodiments of the present invention are directed to a component supply method of subdividing a wafer of a material such as ceramic or silicon for obtaining individual components and supplying such individual components to a subsequent processing step.

According to the preferred embodiments of the present invention, a flat plate type pallet which has a reference portion for performing location for later processing is prepared, and an adhesive sheet which is formed by a base material having a foam releasable first adhesive layer, whose adhesion can be reduced by heating, provided on its one surface and a second adhesive layer, whose adhesion can not be reduced by heating or can only be reduced by an amount less reduced than the first adhesive layer by heating, provided on another surface. Then, the adhesive sheet is stuck onto one surface of the pallet. Thereafter a wafer is stuck onto the first adhesive layer of the adhesive sheet to have a prescribed positional relation to the reference portion of the pallet. Then the wafer is cut on the basis of the reference portion to obtain individual components, and the adhesion of the first adhesive layer is reduced by heating. Thereafter the individual components obtained by cutting the wafer are taken out from the pallet on the basis of the reference portion, to be supplied to a subsequent step.

According to the preferred embodiments of the present invention, the reference portion provided in the pallet is used for performing location in the steps of adhering an adhesive sheet on a support, adhering a wafer on the adhesive on the support, cutting the wafer and removing the individual components from the support. Thus, it is possible to efficiently supply the components obtained by subdividing the wafer systematically to a next step at a low cost, with no requirement for a high-priced image processor.

While the conventional method shown in FIG. 4 employs the thrust pin in order to smoothly remove the components from the adhesive sheet, the adhesion of the foam releasable first adhesive layer is reduced by heating before the components are removed according to the preferred embodiments of the present invention. Thus, it is possible to easily separate and remove the components from the adhesive sheet without having to use thrust pin. Therefore, no damage is caused in the components by the thrust pin and it is possible to omit the complicated operation of exchanging such a thrust pin.

The foregoing and other objects, features, aspects and advantages of the preferred embodiments of the present invention will become more apparent from the following detailed description of the preferred embodiments of the present invention when taken in conjunction with the accompanying drawings.

DESCRIPTION OF PREFERRED EMBODIMENTS

A preferred embodiment of the present invention is now described with reference to the drawings, to clarify the inventive component supply method.

Figure 5:
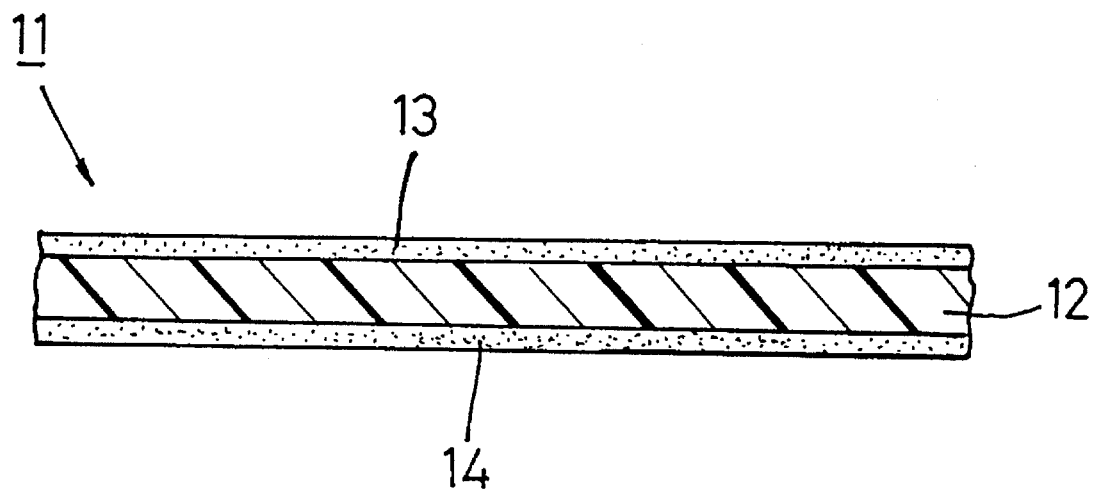
FIG. 5 is a partially fragmented sectional view showing an adhesive sheet which is employed in a preferred embodiment of the present invention.

FIG. 5 illustrates an adhesive sheet 11 which is employed in this preferred embodiment. This adhesive sheet 11 is formed by a base material 12 of a synthetic resin film such as a PET film, a first adhesive layer 13 which is provided on one surface thereof and a second adhesive layer 14 which is provided on another surface. The first adhesive layer 13 is made of a foam releasable adhesive whose adhesion can be reduced by heating. Such a foam releasable adhesive can be prepared from an acrylic adhesive and an isobutane-based foaming agent. The second adhesive layer 14 is made of an adhesive whose adhesion is not capable of being reduced by heating or can only be reduced by an amount less than the first adhesive layer 13 by heating. The second adhesive layer 14 can be prepared from an acrylic adhesive, for example.

Figure 6:
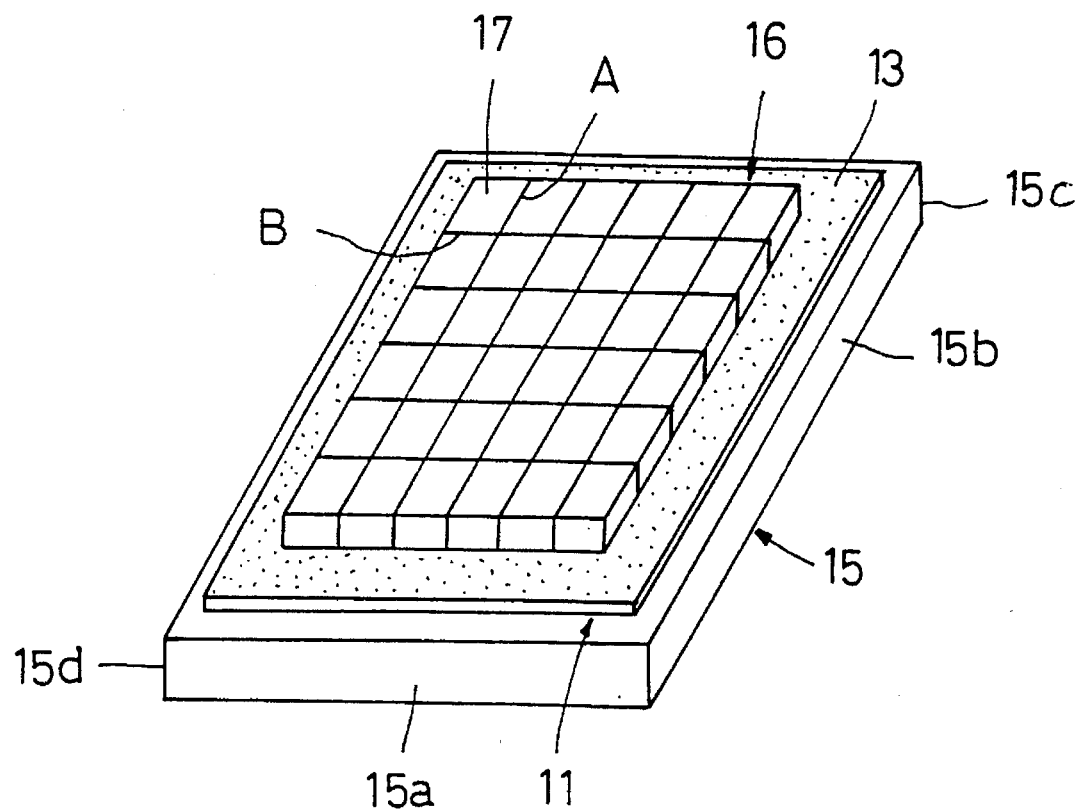
FIG. 6 is a perspective view showing a wafer which is stuck onto a pallet and cut into individual components in the preferred embodiment.

Then, a pallet 15 which is in the form of a substantially rectangular plate is prepared as shown in FIG. 6, so that the second adhesive layer 14 (see FIG. 5) of the adhesive sheet 11 is stuck onto the upper surface of this pallet 15. In this case, the adhesive sheet 11 is stuck to a prescribed position on the upper surface of the pallet 15 on the basis of side surfaces 15a and 15d thereof. This prescribed position is set such that the adhesive sheet 11 is separated from the side surfaces 15a to 15d by prescribed linear dimensions.

According to this preferred embodiment, the side surfaces 15a to 15d of the pallet 15 correspond to "reference portions" of the present invention.

The pallet 15 may be formed by a member having a cavity under the central region of the sheet 16 or that in the form of a substantially rectangular frame, in place of the substantially rectangular plate type member having the shape illustrated in the figures.

Then, a wafer 16 is stuck onto the upper surface of the adhesive sheet 11 through the adhesion of the first adhesive layer 13. The wafer 16 is stuck so as to have a prescribed positional relation to reference surfaces which are defined by the side surfaces 15a to 15d of the pallet 15. Then, the wafer 16 is cut by a dicing unit on the basis of the aforementioned positional relation, to obtain individual components 17. FIG. 6 shows a plurality of cutting lines A and B for dividing the wafer 16 into the number of components 17.

The dicing unit cuts the wafer 16 at a prescribed position on the basis of the side surfaces 15a and 15d of the pallet 15. Since the wafer 16 is thus cut on the basis of the side surfaces 15a to 15d of the pallet 15, the as-obtained components 17 are being stuck on the adhesive sheet 11 in states having prescribed positional relations with respect to the side surfaces 15a to 15d of the pallet 15. Such prescribed positional relations are also set so that the components 17 are separated by prescribed distances from the side surfaces 15a to 15d serving as reference surfaces.

Figure 7:
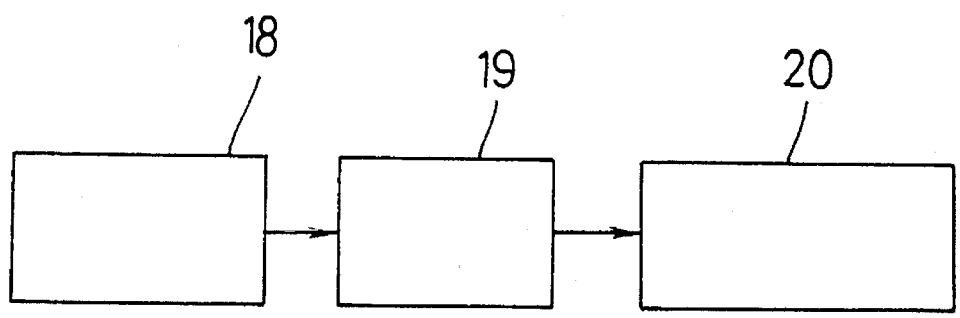
FIG. 7 typically illustrates respective steps of the preferred embodiment.

Thereafter the pallet 15 is carried from the dicing unit 18 to a heating unit 19 as shown in FIG. 7, by an arbitrary carrier such as a belt conveyor. The pallet 15 is also carried to a locating station 20 described later by a similar carrier.

The heating unit 19 may be formed by a heater for heating the pallet 15 from a lower side, or a heating/drying furnace for receiving the pallet 15 therein. The heating unit 19 heats the pallet 15 to reduce the adhesion of the first adhesive layer 13 of the adhesive sheet 11. Consequently, the plurality of components 17 being stuck on the adhesive sheet 11 can be easily separated from the first adhesive layer 13 due to such reduction of its adhesion.

Then the pallet 15 is carried to the locating station 20.

Figure 1:
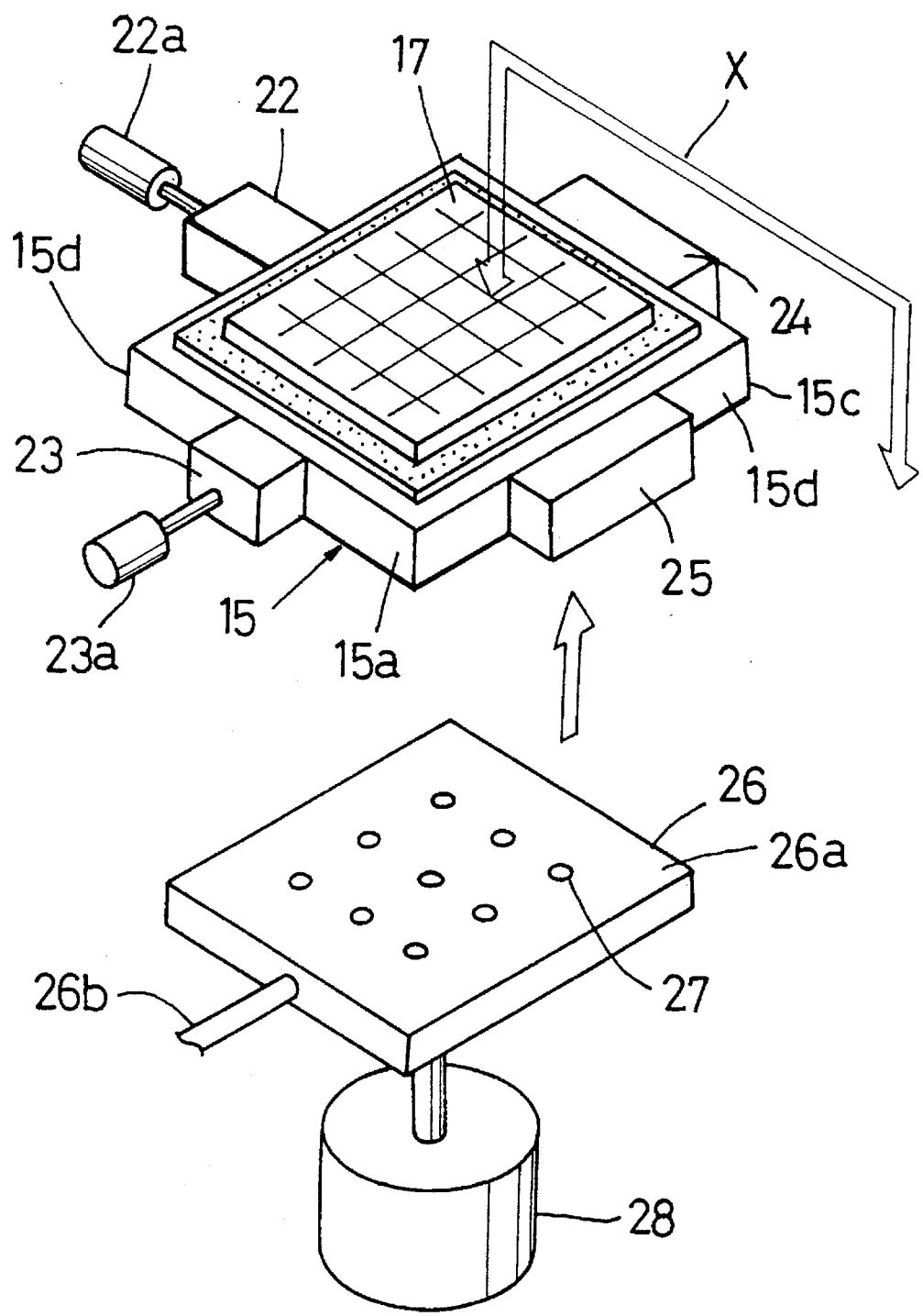
FIG. 1 is a perspective view for illustrating a step of taking out components from a pallet in a preferred embodiment of the present invention.
Figure 2:
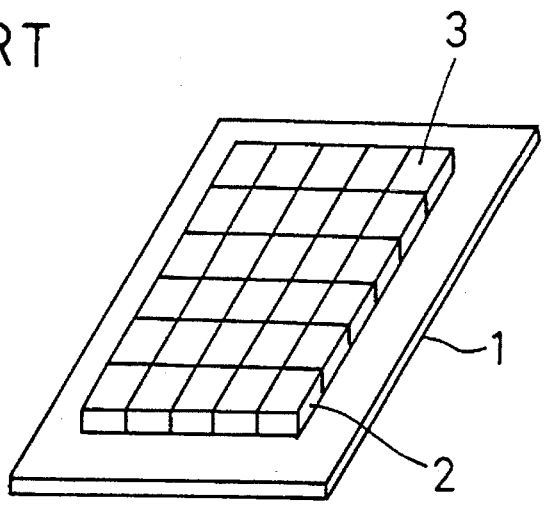
FIG. 2 is a perspective view showing a wafer which is stuck onto a support member and cut into chips in a conventional method.
Figure 3A:
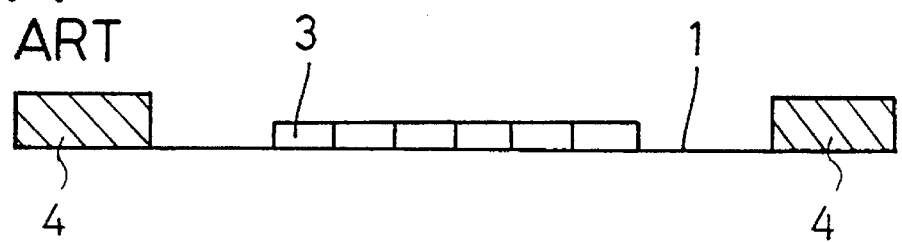
FIGS. 3A and 3B ape sectional views for illustrating a step of separating components, which are cut on an adhesive sheet, from each other by expanding the adhesive sheet in a first conventional method of supplying components.
Figure 3B:
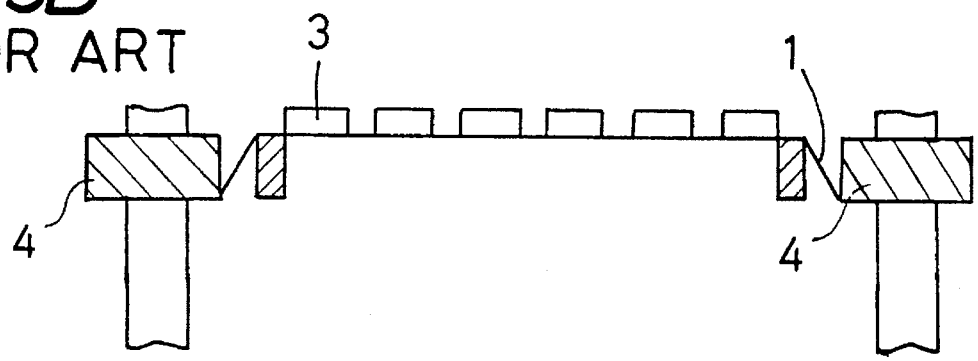

In the locating station 20, the pallet 15 is located at a prescribed position, as shown in FIG. 1. At this time, movable guides 22 and 23 which are driven by air cylinders 22a and 23a push the side surfaces 15a and 15d of the pallet 15 to bring the side surfaces 15b and 15c into contact with fixed guides 24 and 25, thereby locating the pallet 15 at the prescribed position.

When the side surfaces 15b and 15c are brought into contact with the fixed guides 24 and 25, the pallet 15 is fixed at the position by a fixing plate 26. This fixing plate 26 has a number of through holes 27, which communicate with a tube 26b connected to suction means (not shown). The fixing plate 26 can be vertically driven by a vertical drive unit 28 which is formed by an air cylinder or the like. The pallet 15 is fixed onto an upper surface 26a of the fixing plate 26.

When the pallet 15 is located and fixed in the aforementioned manner, a component discharge unit such as a suction chuck is brought from the above into contact with a component 17 to be removed, to discharge and supply the same to a next step as shown by arrow X in FIG. 1.

Since the pallet 15 is located at the prescribed position through the side surfaces 15b and 15c and the components 17 are also placed at the prescribed positions with respect to the side surfaces 15a and 15b, it is possible to reliably remove the target component 17 by downwardly moving the discharge unit such as a suction chuck while maintaining a prescribed positional relation with respect to the side surfaces 15a and 15d. Namely, it is possible to reliably discharge the target component 17 in response to distances from some of the side surfaces 15a to 15d.

Figure 4:
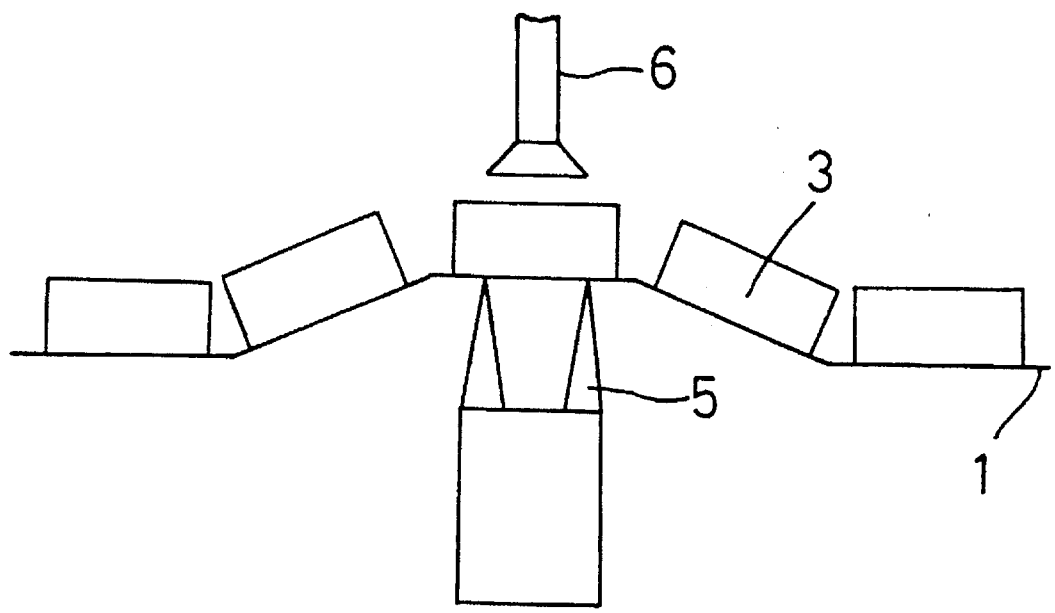
FIG. 4 is a typical side elevational view for illustrating a step of taking out components in a second conventional method of supplying components.

Since the adhesion of the first adhesive layer 13 of the adhesive sheet 11 is reduced by the aforementioned heating, it is possible to extremely easily remove, i.e., separate the target component 17 from the adhesive sheet 11. Therefore, it is not necessary to use the thrust pin 5 which has been employed in the conventional method shown in FIG. 4. Thus, the components 17 are not damaged when the components are taken out from the pallet 15, while it is possible to omit the complicated operation of exchanging the thrust pin 5.

The components 17 can be removed by any means in place of the suction chuck, so far as the means can temporarily fix the target component 17 and then separate the same. Further, the components 17 may not necessarily be removed one by one from the pallet 15, but a plurality of such components can be simultaneously removed.

Although the pallet 15 having a substantially rectangular plane shape is employed in the aforementioned preferred embodiment, this pallet may alternatively have another plane shape such as a circular one, so far as the same has reference portions for enabling location.

Figure 8:
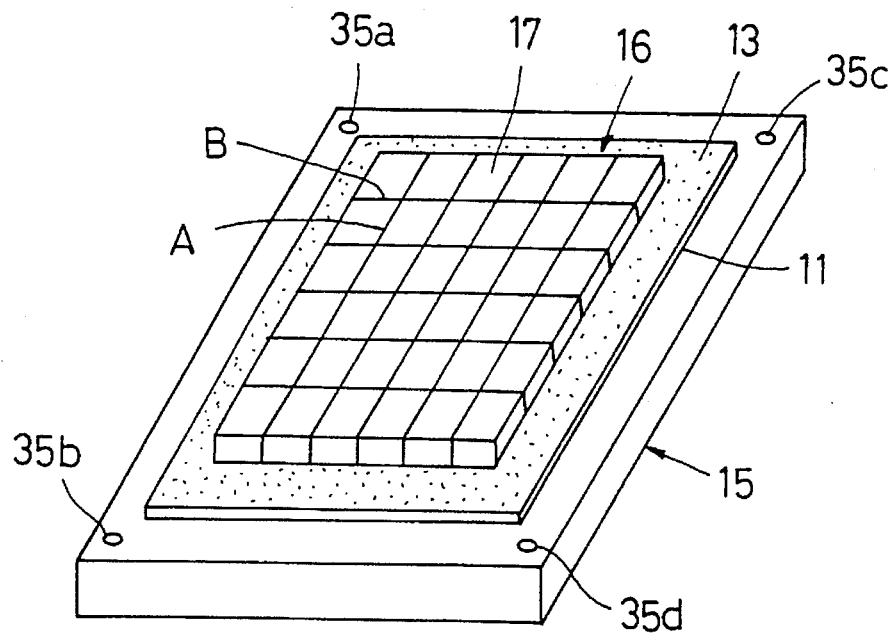
FIG. 8 is a perspective view showing an adhesive sheet and a wafer which are stuck onto a pallet provided with holes serving as reference portions.

While the side surfaces 15a to 15d of the pallet 15 are employed as the reference portions in the aforementioned preferred embodiment, holes 35a to 35d may alternatively be formed in corner portions of a pallet 35 as shown in FIG. 8, for carrying out the aforementioned locating step.

Figure 9:
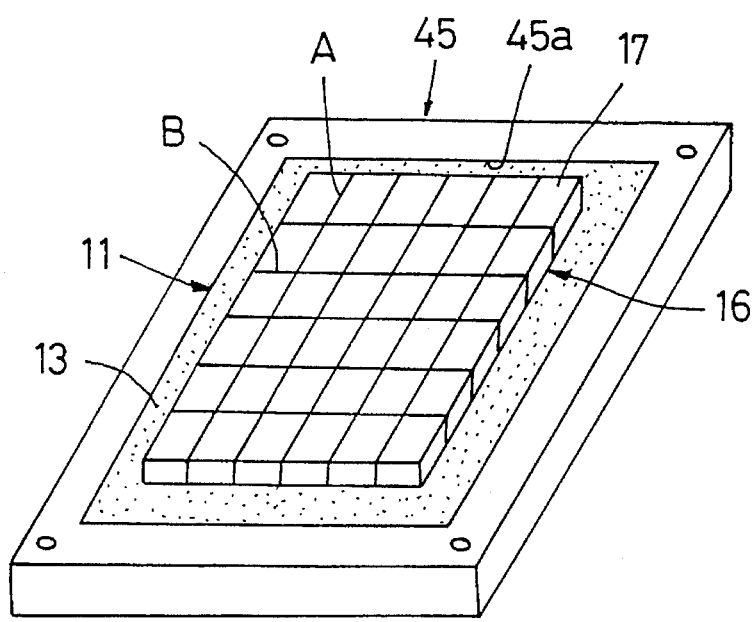
FIG. 9 is a perspective view showing a wafer which is arranged in a cavity of a pallet.

As shown in FIG. 9, further, a cavity 45a may be formed in an upper surface of a pallet 45 in response to the shape of an adhesive sheet 11, so that the adhesive sheet 11 is arranged in this cavity 45a. In this case, the position for sticking the adhesive sheet 11 is further accurately decided on the basis of the aforementioned cavity 45a.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A component supply method comprising the steps of:
   providing a pallet having a reference portion comprising side surfaces of the pallet used for locating objects to be mounted on said pallet for processing;
   providing an adhesive sheet formed by a base material having a first surface, a second surface, a first adhesive layer made of a foam releasable adhesive and located on said first surface, and a second adhesive layer located on said second surface, said first adhesive layer being capable of having its adhesion reduced by heating, said second adhesive layer not being capable of having its adhesion reduced by heating or only being capable of having its adhesion reduced by an amount less than said first adhesive layer by heating;
   sticking said adhesive sheet onto a surface of said pallet while aligning said adhesive sheet to have a predetermined positional relation with respect to said reference portion of said pallet;
   sticking a wafer onto said first adhesive layer of said adhesive sheet while aligning said wafer to have a predetermined positional relation with respect to said reference portion of said pallet;
   cutting said wafer on the basis of said reference portion thereby obtaining individual components;
   reducing adhesion of said first adhesive layer by heating;
   positioning the individual components by moving a movable guide member into contact with the side surfaces of the pallet to move the side surfaces of the pallet into contact with a fixed guide member; and
   removing said individual components from said first adhesive layer on the basis of said reference portion.

2. A component supply method in accordance with claim 1, wherein a plurality of said reference portions are provided on said pallet.

3. A component supply method in accordance with claim 2, wherein said reference portions comprise a plurality of side surfaces of said pallet.

4. A component supply method in accordance with claim 2, wherein said plurality of reference portions comprise a plurality of holes provided in corner portions of said pallet.

5. A component supply method in accordance with claim 3, wherein said predetermined positional relation of said adhesive sheet with respect to said reference portion is set such that said adhesive sheet is separated from each of said side surfaces of said pallet by a predetermined distance.

6. A component supply method in accordance with claim 1, wherein said predetermined positional relation of said wafer with respect to said reference portion is set on the basis of a predetermined distance between said reference portion and said wafer.

7. A component supply method in accordance with claim 1, wherein said pallet is formed by a plate member.

8. A component supply method in accordance with claim 7, wherein said second adhesive layer of said adhesive sheet is stuck onto said surface of said pallet.

9. A component supply method comprising the steps of:
   providing a pallet having a reference portion used for locating objects to be mounted on said pallet for processing;
   providing an adhesive sheet formed by a base material having a first surface, a second surface, a first adhesive layer made of a foam releasable adhesive and located on said first surface, and a second adhesive layer located on said second surface, said first adhesive layer being capable of having its adhesion reduced by heating, said second adhesive layer not being capable of having its adhesion reduced by heating or only being capable of having its adhesion reduced by an amount less than said first adhesive layer by heating;
   sticking said adhesive sheet onto a surface of said pallet while aligning said adhesive sheet to have a predetermined positional relation with respect to said reference portion of said pallet;
   sticking a wafer onto said first adhesive layer of said adhesive sheet while aligning said wafer to have a predetermined positional relation with respect to said reference portion of said pallet;
   cutting said wafer on the basis of said reference portion thereby obtaining individual components;
   reducing adhesion of said first adhesive layer by heating; and
   removing said individual components from said first adhesive layer on the basis of said reference portion.

10. A component supply method in accordance with claim 9, wherein a plurality of said reference portions are provided on said pallet.

11. A component supply method in accordance with claim 10, wherein said reference portions comprise a plurality of side surfaces of said pallet.

12. A component supply method in accordance with claim 10, wherein said plurality of reference portions comprise a plurality of holes provided in corner portions of said pallet.

13. A component supply method in accordance with claim 11, wherein said predetermined positional relation of said adhesive sheet with respect to said reference portions is set such that said adhesive sheet is separated from each said side surfaces by a predetermined distance.

14. A component supply method in accordance with claim 9, wherein said prescribed positional relation of said wafer with respect to said reference portion is set on the basis of a distance between said reference portion and said wafer.

15. A component supply method in accordance with claim 9, wherein said pallet is formed by a plate member.

16. A component supply method in accordance with claim 15, wherein said second adhesive layer of said adhesive sheet is stuck onto said surface of said pallet.

* * * * *